United States Patent
Marauska et al.

(10) Patent No.: US 10,718,825 B2
(45) Date of Patent: Jul. 21, 2020

(54) STRAY MAGNETIC FIELD ROBUST MAGNETIC FIELD SENSOR AND SYSTEM

(71) Applicant: NXP B.V., Eindhoven (NL)

(72) Inventors: Stephan Marauska, Kaltenkirchen (DE); Jörg Kock, Horst (DE); Hartmut Matz, Hamburg (DE); Mark Isler, Hamburg (DE); Dennis Helmboldt, Hamburg (DE)

(73) Assignee: NXP B.V., Eindhoven (NL)

( * ) Notice: Subject to any disclaimer, the term of this patent is extended or adjusted under 35 U.S.C. 154(b) by 353 days.

(21) Appl. No.: 15/703,102

(22) Filed: Sep. 13, 2017

(65) Prior Publication Data

US 2019/0079141 A1    Mar. 14, 2019

(51) Int. Cl.
*G01R 33/00* (2006.01)
*G01D 5/20* (2006.01)
(Continued)

(52) U.S. Cl.
CPC ........... *G01R 33/0076* (2013.01); *G01D 3/08* (2013.01); *G01D 5/145* (2013.01); *G01D 5/2033* (2013.01);
(Continued)

(58) Field of Classification Search
CPC ............ G01R 33/0017; G01R 33/0005; G01R 33/0076; G01R 33/09; G01R 33/091;
(Continued)

(56) References Cited

U.S. PATENT DOCUMENTS

| 5,729,137 A | 3/1998 | Daughton et al. |
| 5,942,895 A | 8/1999 | Popovic et al. |

(Continued)

FOREIGN PATENT DOCUMENTS

| DE | 10314602 A1 | 10/2004 |
| EP | 2639594 A2 | 9/2013 |

(Continued)

OTHER PUBLICATIONS

Notice of Allowance; U.S. Appl. No. 15/647,709; 9 pages (dated Feb. 12, 2019).

(Continued)

*Primary Examiner* — Scott B Geyer
(74) *Attorney, Agent, or Firm* — Charlene R. Jacobsen

(57) ABSTRACT

A magnetic field sensor includes a magnetic sense element and a shield structure formed on a substrate. The shield structure fully encircles the magnetic sense element for suppressing stray magnetic fields along a first axis and a second axis, both of which are parallel to a surface of the substrate and perpendicular to one another. A magnetic field is oriented along a third axis perpendicular to the surface of the substrate, and the magnetic sense element is configured to sense a magnetic field along the first axis. A magnetic field deflection element, formed on the substrate proximate the magnetic sense element, redirects the magnetic field from the third axis into the first axis to be sensed as a measurement magnetic field by the magnetic sense element. At least two magnetic field sensors, each fully encircled by a shield structure, form a gradient unit for determining a magnetic field gradient.

20 Claims, 10 Drawing Sheets

(51) Int. Cl.
*G01D 3/08* (2006.01)
*G01D 5/14* (2006.01)
*G01R 33/09* (2006.01)
*G01R 33/022* (2006.01)
*H01L 41/06* (2006.01)
*H01L 41/12* (2006.01)
*G01R 15/20* (2006.01)

(52) U.S. Cl.
CPC ....... *G01R 15/207* (2013.01); *G01R 33/0005* (2013.01); *G01R 33/0017* (2013.01); *G01R 33/022* (2013.01); *G01R 33/09* (2013.01); *G01R 33/093* (2013.01); *H01L 41/06* (2013.01); *H01L 41/125* (2013.01)

(58) Field of Classification Search
CPC ..... G01R 15/205; G01R 15/207; H01L 41/06; H01L 41/125
See application file for complete search history.

(56) References Cited

U.S. PATENT DOCUMENTS

| | | | |
|---|---|---|---|
| 6,064,197 | A | 5/2000 | Lochmann et al. |
| 6,545,462 | B2 | 4/2003 | Schott et al. |
| 7,095,228 | B2 | 8/2006 | Steele et al. |
| 7,112,957 | B2 | 9/2006 | Bicking |
| 7,956,604 | B2 | 6/2011 | Ausserlechner |
| 8,125,216 | B2 | 2/2012 | Thomas et al. |
| 8,421,453 | B2 | 4/2013 | Bauer |
| 8,664,945 | B2 | 3/2014 | Laville et al. |
| 9,091,702 | B2 | 7/2015 | Ausserlechner |
| 9,383,227 | B2 | 7/2016 | Sterling |
| 10,048,294 | B2 * | 8/2018 | Gorai ................... G01R 15/202 |
| 10,605,624 | B2 * | 3/2020 | Forthaus ............ G01R 33/0017 |
| 2008/0122047 | A1 * | 5/2008 | Honer .................. H01L 23/552 257/660 |
| 2009/0262466 | A1 | 10/2009 | Kurata et al. |
| 2012/0217963 | A1 * | 8/2012 | Naka ................... G01R 15/207 324/253 |
| 2013/0265039 | A1 | 10/2013 | Cai et al. |
| 2015/0097560 | A1 * | 4/2015 | Kawakami ............. G01R 33/09 324/252 |
| 2015/0137796 | A1 | 5/2015 | Ausserlechner |
| 2016/0011278 | A1 * | 1/2016 | Kim ...................... H05K 9/0069 324/225 |
| 2016/0091575 | A1 * | 3/2016 | Yamada ............. G01R 33/0017 324/225 |
| 2016/0202331 | A1 * | 7/2016 | Chen ..................... G01R 33/10 324/205 |
| 2016/0360987 | A1 * | 12/2016 | Miyasaka .......... A61B 5/04007 |
| 2017/0033278 | A1 | 2/2017 | Lapicki et al. |
| 2017/0370883 | A1 * | 12/2017 | Chin ..................... G01R 33/18 |
| 2019/0018080 | A1 * | 1/2019 | Marauska .......... G01R 33/0076 |
| 2019/0293733 | A1 * | 9/2019 | Esaka ................ G01R 33/0017 |

FOREIGN PATENT DOCUMENTS

| | | |
|---|---|---|
| EP | 2639594 A3 | 9/2013 |
| JP | 2009 300150 A | 12/2009 |
| JP | 5149964 B2 | 12/2012 |
| JP | 2013 172040 A | 9/2013 |
| JP | 2015-141121 A | 8/2015 |
| WO | WO-98/54547 A1 | 12/1998 |
| WO | WO-2009/151024 A1 | 12/2009 |

OTHER PUBLICATIONS

U.S. Appl. No. 15/647,709; not yet published; 44 pages (dated Jul. 12, 2017).
Non Final Office Action 15/647,709; 19 pages (dated Oct. 16, 2018).
Popovic, Radivoje S. et al; "Hall ASICs with Integrated Magnetic Concentrators"; retrieved from the Internet http://www.gmw.com/magnetic_sensors/sentron/2sa/documents/TN_Hall_IMC_16oct02.pdf ; 12 pages (Oct. 16, 2002).
Smith, Neil et al; "A high-sensitivity magnetoresistive magnetometer"; Journal of Applied Physics, 69 (8), retrieved from the Internet http://aip.scitation.org/doi/abs/10.1063/1.348130; 4 pages (Apr. 15, 1991).

* cited by examiner

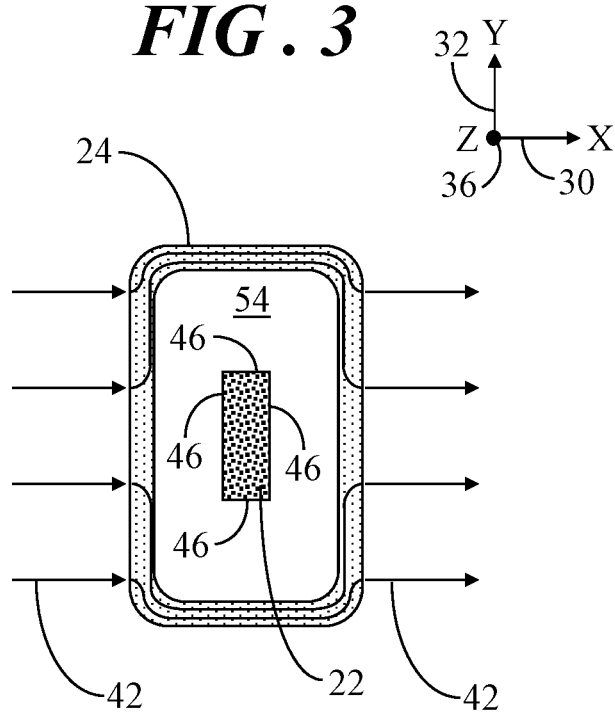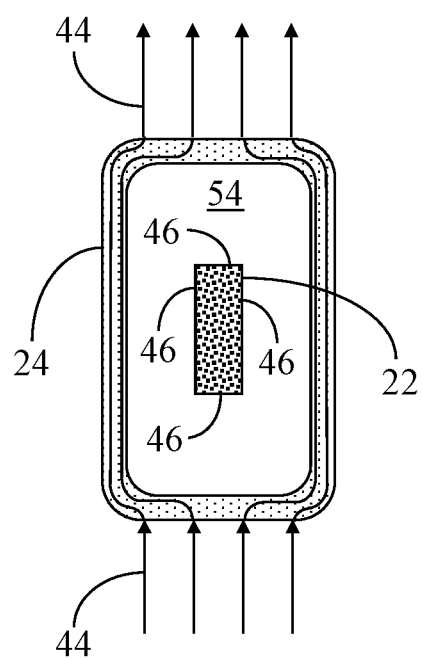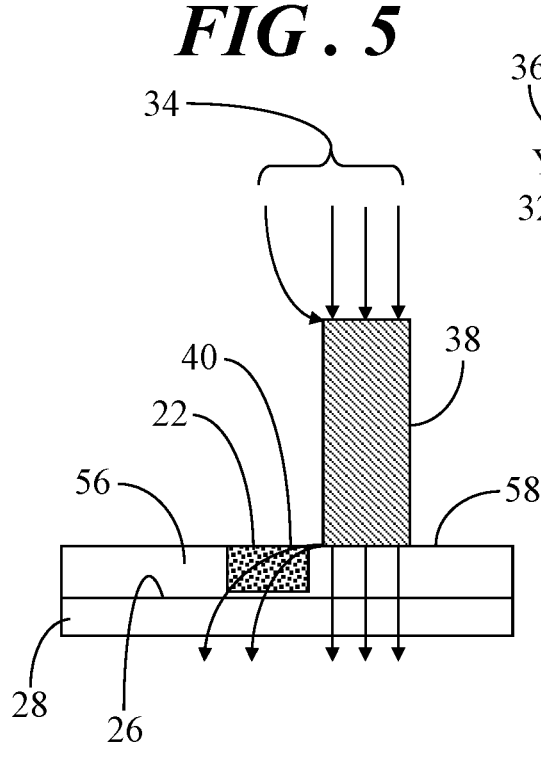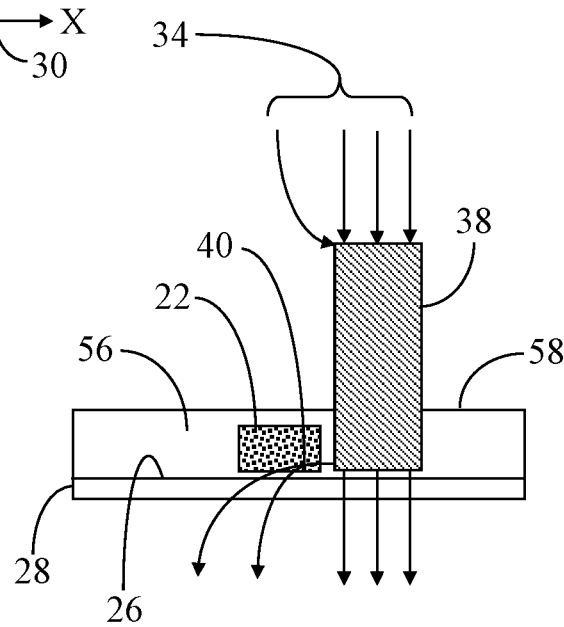

STRAY MAGNETIC FIELD ROBUST MAGNETIC FIELD SENSOR AND SYSTEM

TECHNICAL FIELD OF THE INVENTION

The present invention relates generally to magnetic field sensors. More specifically, the present invention relates to magnetic field sensors with integrated shield structures in a gradiometer configuration for measuring out-of-plane magnetic fields and a system incorporating the magnetic field sensors for measuring the out-of-plane magnetic fields while suppressing in-plane stray magnetic fields.

BACKGROUND OF THE INVENTION

Magnetic field sensor systems are utilized in a variety of commercial, industrial, and automotive applications to measure magnetic fields for purposes of speed and direction sensing, rotation angle sensing, proximity sensing, and the like. A magnetic interference field, also referred to as a stray magnetic field, along non-sensing and sensing axes of a magnetic field sensor may change the sensitivity and linearity range of the sensor, thus negatively effecting the magnetic field detection quality.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

FIG. 3 shows a top view of a magnetic sense element and a shield structure demonstrating shunting of a stray magnetic field directed along a first axis;

FIG. 4 shows a top view of a magnetic sense element and a shield structure demonstrating shunting of a stray magnetic field directed along a second axis;

FIG. 5 shows a side view of a magnetic sense element and a magnetic field deflection element in accordance with an embodiment;

FIG. 6 shows a side view of a magnetic sense element and a magnetic field deflection element in accordance with another embodiment;

DETAILED DESCRIPTION

In overview, the present disclosure concerns magnetic field sensors and magnetic field sensor systems with integrated magnetic field shield structures for measuring magnetic fields while suppressing stray magnetic fields. More particularly, a magnetic field sensor includes one or more magnetic sense elements each of which is fully encircled by an integrated magnetic field shield structure for measuring out-of-plane magnetic fields while suppressing in-plane magnetic interference fields. The magnetic field shield structures may be vertically integrated with the magnetic sense elements to achieve reductions in size and cost savings. Further, the magnetic field sense elements with the shield structures can be implemented in various system configurations for the purpose of rotation angle sensing. One system configuration may encompass a gradiometer, i.e., a gradient detection approach, for rotation angle sensing. The gradient detection approach may enable the cancellation of homogenous magnetic interference fields to enhance the magnetic field detection quality.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
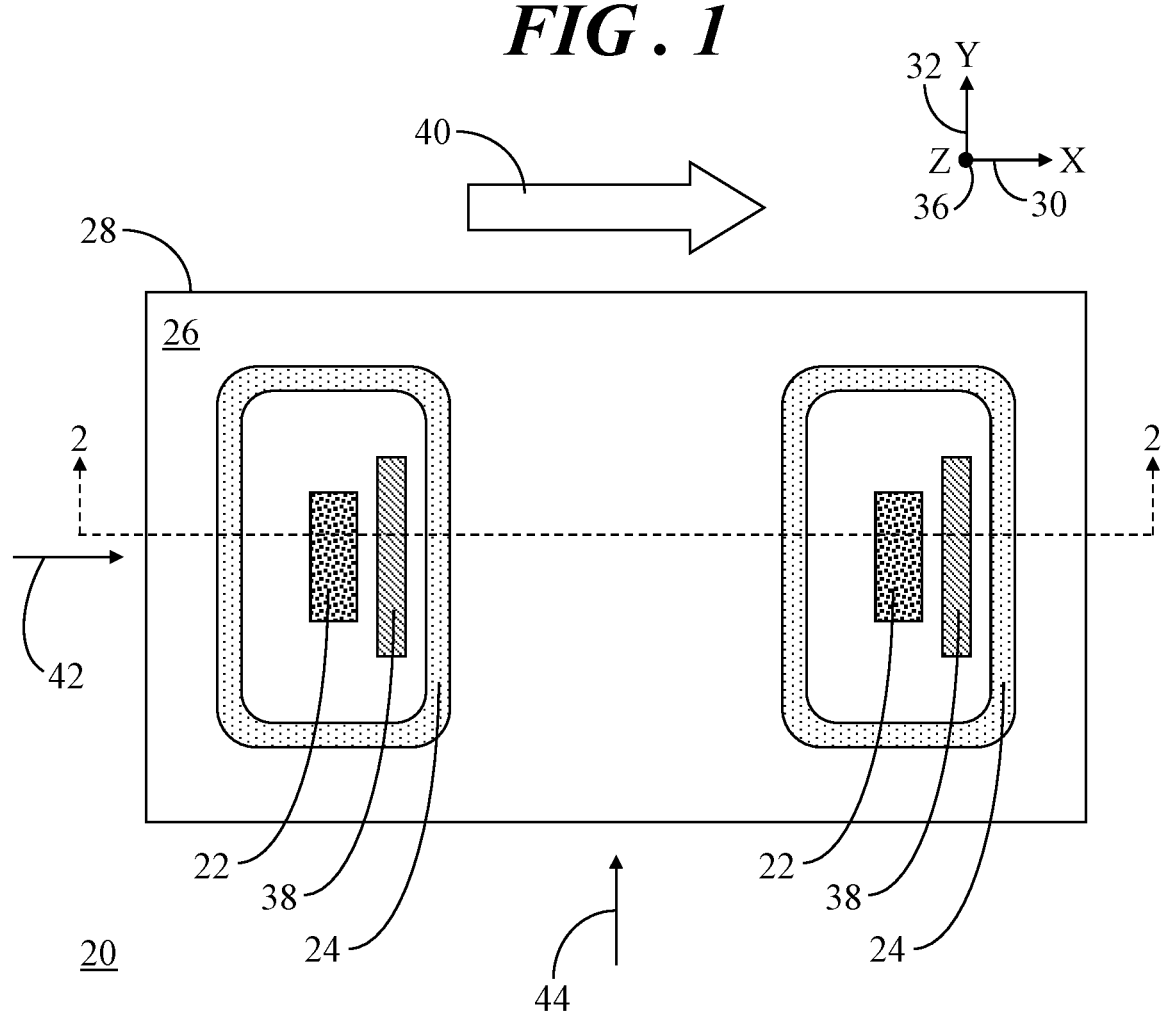
FIG. 1 shows a top view of magnetic field sensor that includes magnetic sense elements each of which is fully encircled by a shield structure.
Figure 2:
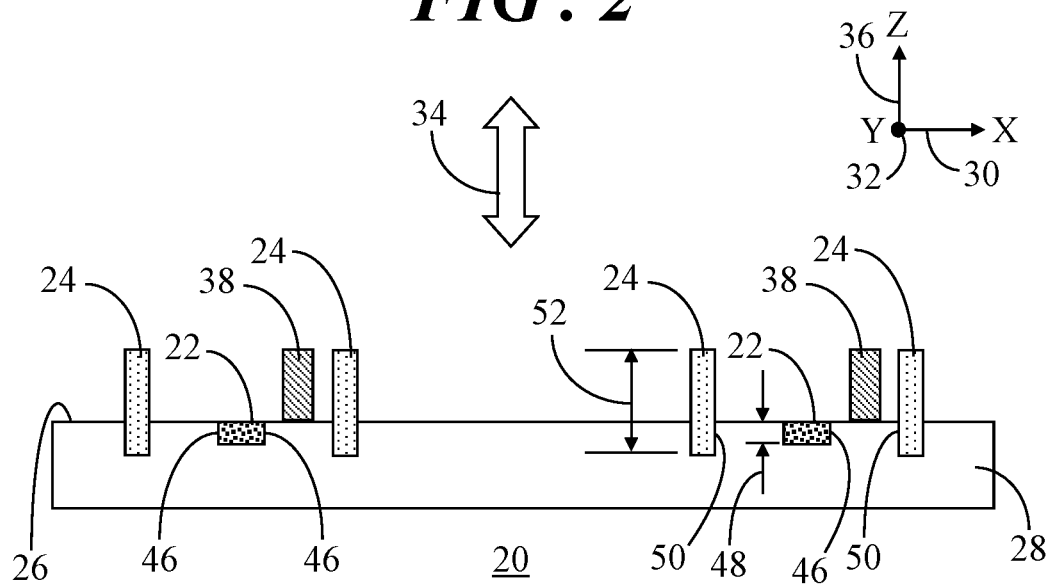
FIG. 2 shows a side sectional view of the magnetic field sensor along section lines 2-2 of FIG. 1.

Referring to FIGS. 1 and 2, FIG. 1 shows a top view of magnetic field sensor 20 that includes magnetic sense elements 22, each of which is fully encircled by a shield structure 24, and FIG. 2 shows a side sectional view of magnetic field sensor 20 along section lines 2-2 of FIG. 1. In an embodiment, magnetic sense elements 22 and shield structures 24 are formed on or in a surface 26 of a substrate 28, and surface 26 of substrate 28 may be passivated. Magnetic sense elements 22 represent any of a variety of magnetoresistors, such as tunnel magnetoresistance (TMR) sensors, anisotropic magnetoresistance (AMR) sensors, giant magnetoresistance (GMR) sensors, and the like. Further, magnetic sense elements 22 may be a single resistor element as a dot or stripe, or magnetic sense elements 22 may be an array that includes multiple single resistor elements.

In a three-dimensional coordinate system having a first axis (referred to as an X-axis 30) and a second axis (referred to as a Y-axis 32) that are parallel to surface 26 of substrate 28 and perpendicular to one another, magnetic field sensor 20 is configured to sense an out-of-plane external magnetic field 34 (denoted by a wide bi-directional arrow in FIG. 2) directed along a third axis (referred to as a Z-axis 36) that is oriented perpendicular to surface 26 of substrate 28.

In this example, the sensitive axis of magnetic sense elements 22 corresponds to X-axis 30. Accordingly, in order to sense the out-of-plane magnetic field 34 directed along Z-axis 36, magnetic field sensor 20 further includes magnetic field deflection elements 38 formed on or in substrate 28 proximate each magnetic sense element 22. Magnetic field deflection elements 38 are configured to redirect the out-of-plane magnetic field 34 from Z-axis 36 into X-axis 30 to be sensed as an in-plane measurement magnetic field 40 (denoted by a wide arrow in FIG. 1) by magnetic sense elements 22. In an embodiment discussed in connection with FIGS. 18-27 below, in-plane measurement magnetic field 40 may be a magnetic field gradient directed rightward on the page and corresponding to out-of-plane magnetic field 34. Hence, the rightwardly directed wide arrow denoting in-plane measurement magnetic field 40.

In alternative embodiments, the sensitive axis of magnetic sense elements 22 may correspond to Z-axis 36. In such a configuration, shield structures 24 would still fully encircle the magnetic sense elements 22 in order to suppress stray magnetic fields 42, 44 along X-axis 30 and Y-axis 32. However, this configuration would not include magnetic field deflection elements 38 since the out-of-plane magnetic field 34 would be effectively sensed by magnetic sense elements 22 without redirection into an axis parallel to surface 26 of substrate 28.

Stray magnetic fields 42, 44 (denoted by narrow arrows) are adverse magnetic fields that may exist around magnetic field sensor 20. Stray magnetic fields 42, 44 may be static (i.e., non-periodic) or alternating (i.e., periodic) and may result from external disturbances. Stray magnetic fields 42, 44 may change the sensitivity and linearity range of the sensor if injected onto the non-sensing axis or if stray magnetic fields parallel to the sensing axis are superimposed onto the measurement signal, thus negatively effecting the magnetic field detection quality.

In accordance with an embodiment, each magnetic sense element 22 includes sidewalls 46 that exhibit a first height 48 perpendicular to X- and Y-axes 30, 32 and each shield structure 24 includes structure sidewalls 50 that exhibit a second height 52 perpendicular to X- and Y-axes 30, 32 in which second height 50 is no less than first height. Additionally, each shield structure 24 fully encircles one of magnetic sense elements 22 and one of magnetic field deflection elements 38. It should be observed, however, that shield structure 24 encircles magnetic sense element 22 along X- and Y-axes 30, 32. However, shield structure 24 does not encircle magnetic sense element in a direction perpendicular to surface 26 of substrate 28 (i.e., in a direction parallel to Z-axis 36).

The geometric configuration of shield structure 24 effectively suppresses stray magnetic fields 42, 44 directed along X-axis 30 and Y-axis 32 parallel to surface 26 of substrate 28 and enables detection of external magnetic field 34 perpendicular to surface 26 of substrate 28. By way of example, shield structures 24 shunt (i.e., redirect/deflect) the in-plane stray magnetic fields 42, 44 around magnetic sense elements 22 to suppress, or prevent, detection of the in-plane stray magnetic fields 42, 44 by magnetic sense elements 22. Accordingly, magnetic sense elements 22 are largely limited to sensing magnetic field 34 that is re-directed by magnetic field deflection elements 38 to produce in-plane measurement magnetic field 40.

Referring to FIGS. 3-4, FIG. 3 shows a top view of magnetic sense element 22 and shield structure 24 demonstrating the shunting of stray magnetic field 42 directed along a first axis (e.g., X-axis 30) and FIG. 4 shows a top view of magnetic sense element 22 and a shield structure 24 demonstrating the shunting of stray magnetic field 44 directed along a second axis (e.g. Y-axis 32). In each of FIGS. 3 and 4, magnetic field deflection element 38 is not shown for simplicity. Shield structure 24 may be formed from a high permeability soft magnetic material (e.g., Permalloy) which is deposited such that it encircles, but is laterally spaced apart from, sidewalls 46 of magnetic sense element 22.

In FIG. 3, stray magnetic field 42 along X-axis 30 is shunted or redirected within the continuous configuration of shield structure 24 and therefore around magnetic sense element 22. Likewise, in FIG. 4, stray magnetic field 44 along Y-axis 32 is shunted or redirected within the continuous configuration of shield structure 24 and therefore around magnetic sense element 22. Accordingly, a volume (referred to herein as a central region 54) in which magnetic sense element 22 is located and that is surrounded by shield structure 24 has a strongly reduced magnetic field resulting from stray magnetic fields 42, 44.

Referring to FIGS. 5 and 6, FIG. 5 shows a side view of magnetic sense element 22 and magnetic field deflection element 38 in accordance with an embodiment and FIG. 6 shows a side view of magnetic sense element 22 and magnetic field deflection element 38 in accordance with another embodiment. In FIGS. 5 and 6, shield structure 24 is not shown for simplicity. As shown in FIG. 5, magnetic sense element 22 may be embedded within a protective material layer 56 (e.g., passivation coating, silicon nitride, wafer coat, and the like) on surface 26 of substrate 28. However, magnetic field deflection element 38 is formed at an outer surface 58 of protective layer 56 so that magnetic field deflection element 38 is both laterally and vertically displaced away from sidewall 46 of magnetic sense element 22.

Further, as shown in FIG. 6, magnetic sense element 22 is embedded within protective material layer 56 on surface 26 of substrate 28. However, in this example, at least a portion of magnetic field deflection element 38 is also embedded within and located below outer surface 58 of protective layer so that this portion of magnetic field deflection element 38 is laterally displaced away from sidewall 46 of magnetic sense element 22, but is not vertically displaced away from sidewall 46. In either of the examples shown in FIGS. 5 and 6, the Z-component of magnetic field 34 will be deflected at an edge region of magnetic field deflection element 38 and therefore produce a field component (e.g., in-plane measurement magnetic field 40) in a direction substantially parallel to X-axis 30.

The configuration presented in FIG. 5 generally involves deposition of the material forming magnetic field deflection element 38 on top of a wafer in which multiple magnetic sense elements 22 are formed. Conversely, the configuration presented in FIG. 6 generally involves forming spaces in protective material layer 56 (i.e., lowering the surface of protective material layer 56) and depositing the material forming magnetic field deflection element 38 into these spaces to produce magnetic field deflection element 38 that is at least partially embedded within protective material layer 56. Thus, manufacture of the configuration presented in FIG. 6 may be more complex than the configuration presented in FIG. 5. However, the configuration presented in FIG. 6 with magnetic field deflection element 38 immediately adjacent to magnetic sense element 22 may more effectively deflect the Z-component of magnetic field 34 for detection by magnetic sense element 22 thereby potentially improving signal quality of in-plane measurement magnetic field 40.

Other embodiments may have magnetic field deflection element 38 at different vertical displacements from that which is shown and/or include additional passivation coatings fully encapsulating magnetic field deflection element 38. Additionally, although the vertical displacement of magnetic field deflection element 38 relative to magnetic sense element 22 is discussed in connection with FIGS. 5 and 6, it should be understood that shield structure 24 (FIG. 2) may also be formed on surface 58 of protective layer 56 or at least partially embedded within protective layer 56 as well.

Figure 7:
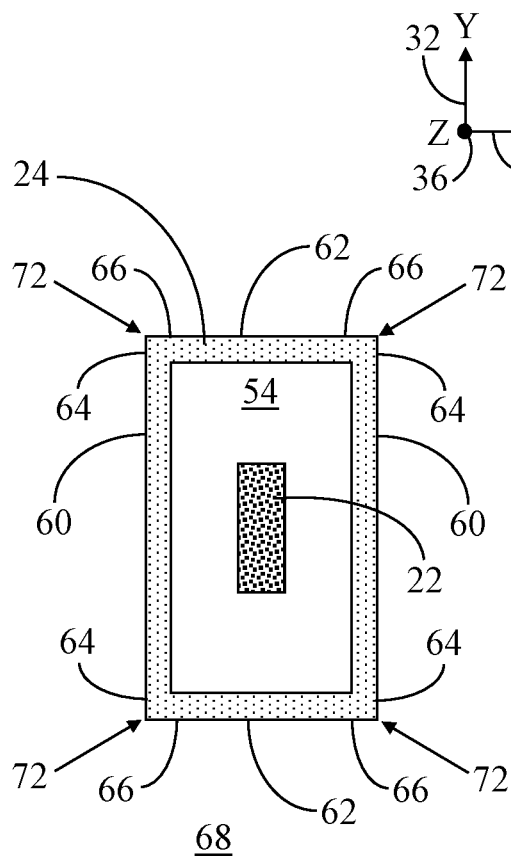
FIG. 7 shows a top view of a magnetic sense element and a shield structure demonstrating a geometric configuration of the shield structure in accordance with an embodiment.
Figure 8:
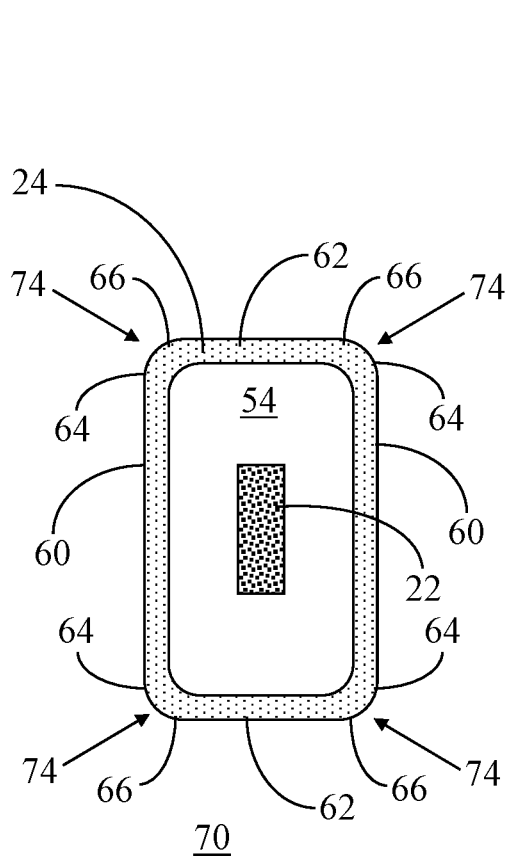
FIG. 8 shows top view of a magnetic sense element and a shield structure demonstrating a geometric configuration of the shield structure in accordance with another embodiment.

Referring to FIGS. 7 and 8, FIG. 7 shows a top view of magnetic sense element 22 and shield structure 24 demonstrating a geometric configuration of shield structure 24 in accordance with an embodiment and FIG. 8 shows top view of magnetic sense element 22 and shield structure 24 demonstrating another geometric configuration of the shield structure in accordance with another embodiment. Again, magnetic field deflection element 38 (FIG. 1) is not shown in FIG. 7 for simplicity.

In FIG. 7, shield structure 24 includes first structure sidewalls 60 facing one another and second structure walls 62 facing one another. First ends 64 of first structure sidewalls 60 are coupled to second ends 66 of second structure sidewalls 62 to yield a first rectangular configuration 68 for shield structure 24, in which the first rectangular configuration 68 surrounds central region 54 in which magnetic sense element 22 is located. Similarly, in FIG. 8, shield structure 24 includes first structure sidewalls 60 facing one another and second structure walls 62 facing one another. First ends 64 of first structure sidewalls 60 are coupled to second ends 66 of second structure sidewalls 62 to yield a second rectangular configuration 70 for shield structure 24, in which the second rectangular configuration 70 surrounds central region 54 in which magnetic sense element 22 is located.

It can be further observed in FIG. 7 that each intersection of first and second ends 64, 66 of first and second structure sidewalls 60, 62 exhibits a sharp edge 72 (i.e., a ninety-degree bend). However, in FIG. 8, each intersection of first and second ends 64, 66 of first and second structure sidewalls 60, 62 exhibits a curved or rounded shape to yield rounded edges 74. These rounded edges 74 may be provided at each transition between first and second structure sidewalls 60, 62 to yield a relatively smooth shape. Sharp edges 72 may lead to significant magnetic field changes (e.g., magnetic field peaks/dips) at these sharp edges 72, thus resulting in inhomogeneity. Conversely, rounded edges 74 may reduce magnetic field changes relative to sharp edges 72, thereby resulting in improved homogeneity.

Figure 9:
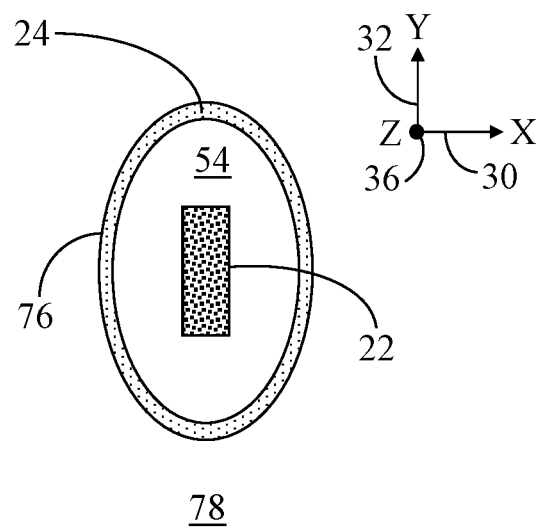
FIG. 9 shows top view of a magnetic sense element and a shield structure demonstrating a geometric configuration of the shield structure in accordance with another embodiment.

FIG. 9 shows top view of magnetic sense element 22 and shield structure 24 demonstrating a geometric configuration of shield structure 24 in accordance with another embodiment. In this example, shield structure 24 has a continuous structure sidewall 76 that yields an elongated elliptical configuration 78 for shield structure 24, in which elongated elliptical configuration 78 surrounds central region 54 in which magnetic sense element 22 is located.

Figure 10:
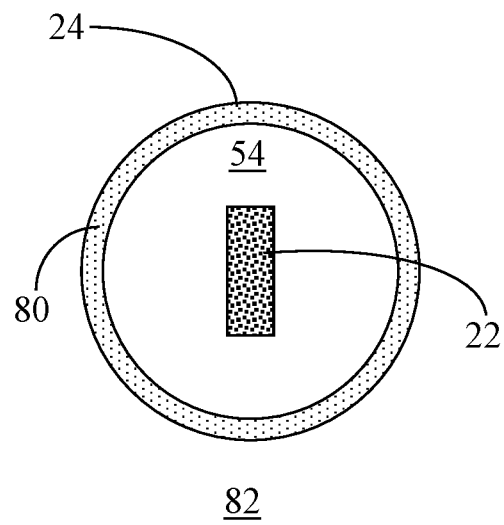
FIG. 10 shows top view of a magnetic sense element and a shield structure demonstrating a geometric configuration of the shield structure in accordance with another embodiment.

FIG. 10 shows top view of magnetic sense element 22 and shield structure 24 demonstrating a geometric configuration of shield structure 24 in accordance with another embodiment. In this example, shield structure 24 has a continuous structure sidewall 80 that yields a circular elliptical configuration 82 for shield structure 24, in which circular elliptical configuration 82 surrounds central region 54 in which magnetic sense element 22 is located.

The various geometric configurations presented in FIGS. 7-10 are for illustrative purposes. Alternative shield structures may have differing shapes that have continuous extending structure walls that fully encircle magnetic sense elements 22 for effectively shunting stray magnetic fields 42, 44. Referring below to FIGS. 11-17, the ensuing discussion will be directed to various geometric configurations for magnetic field deflection elements 38.

Figure 11:
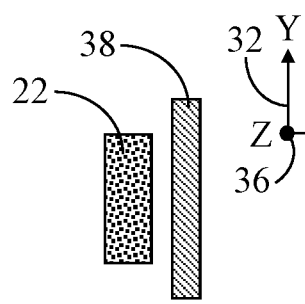
FIG. 11 shows a simplified top view of a configuration of a magnetic sense element with a magnetic field deflection element.
Figure 12:
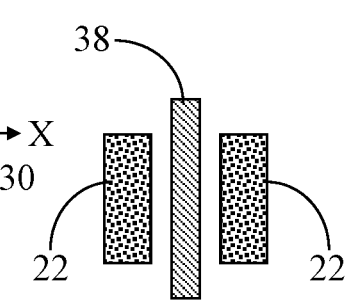
FIG. 12 shows a simplified top view of another configuration of magnetic sense elements with a magnetic field deflection element.
Figure 13:
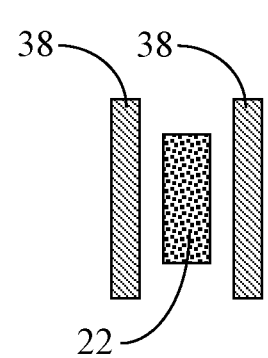
FIG. 13 shows a simplified top view of another configuration of a magnetic sense element with magnetic field deflection elements.

Referring to FIGS. 11-13, FIG. 11 shows a simplified top view of a configuration of magnetic sense element 22 with magnetic field deflection element 38. FIG. 12 shows a simplified top view of another configuration of magnetic sense elements 22 with magnetic field deflection element 38. FIG. 13 shows a simplified top view of another configuration of magnetic sense element 22 with magnetic field deflection elements 38. Each of the configurations shown in FIGS. 11-13 include a dedicated soft magnetic structure for redirecting out-of-plane magnetic field 34 (FIG. 2) into in-plane measurement magnetic field 40 (FIG. 1).

In FIG. 11, a single magnetic field deflection element 38 is located proximate a single magnetic sense element 22 and is therefore designated as a one-sided simple bar. In FIG. 12, a single magnetic field deflection element 38 is located between a pair of magnetic sense elements 22 and is therefore designated as a doubled-sided simple bar. In FIG. 13, a single magnetic sense element 22 is located between a pair of magnetic deflection elements 38, each of which is configured as a simple bar. It should be understood that various alternative configurations of magnetic field deflection element 38 may suitably redirect out-of-plane magnetic field 34 into in-plane measurement magnetic field 40.

Figure 14:
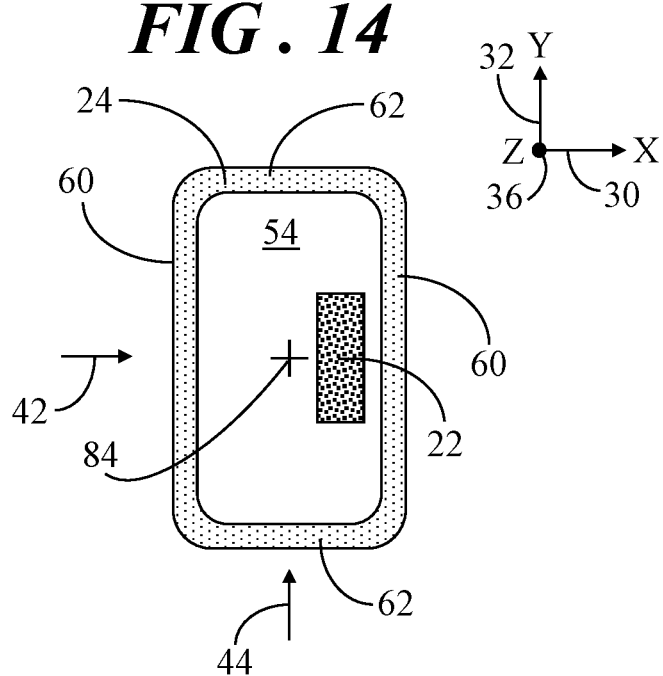
FIG. 14 shows a simplified top view of a configuration of a magnetic sense element with a shield structure.
Figure 15:
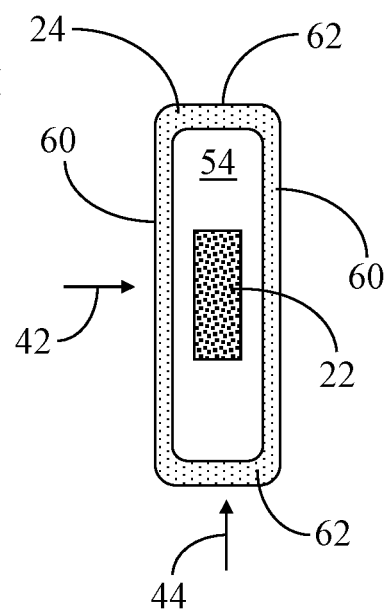
FIG. 15 shows a simplified top view of another configuration of a magnetic sense element with a shield structure.
Figure 16:
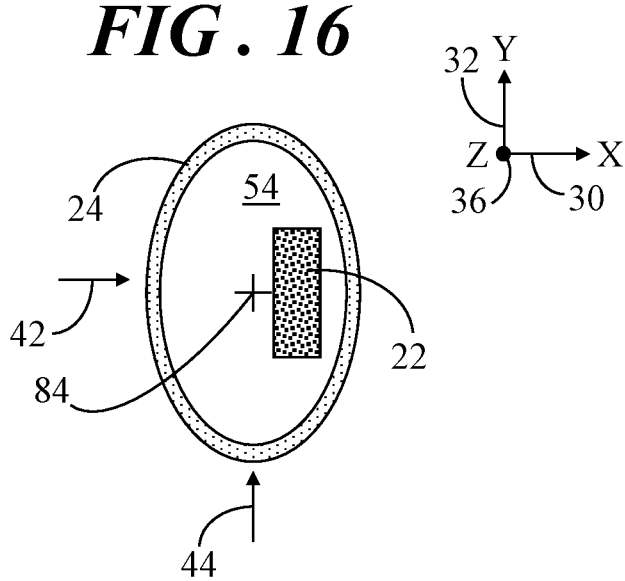
FIG. 16 shows a simplified top view of another configuration of a magnetic sense element with a shield structure.
Figure 17:
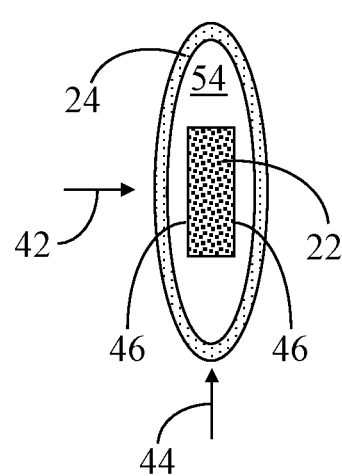
FIG. 17 shows a simplified top view of another configuration of a magnetic sense element with a shield structure.

Referring to FIGS. 14-17, FIG. 14 shows a simplified top view of a configuration of magnetic sense element 22 with shield structure 24. FIG. 15 shows a simplified top view of another configuration of magnetic sense element 22 with shield structure 24. FIG. 16 shows a simplified top view of another configuration of magnetic sense element 22 with shield structure 24. FIG. 17 shows a simplified top view of another configuration of magnetic sense element 22 with shield structure 24. In each of the configurations shown in FIGS. 14-17, shield structure 24 serves a dual purpose of both suppressing stray magnetic fields 42, 44 and redirecting out-of-plane magnetic field 34 (FIG. 2) to produce in-plane measurement magnetic field 40 (FIG. 1).

In FIG. 14, magnetic sense element 22 is located in central region 54 encircled by a rectangular configuration of shield structure 24 at a position that is offset from a center point 84 of central region 54. Thus, shield structure 24 fully encircles magnetic sense element 22 to suppress stray magnetic fields 42, 44. Further, due to the proximity of magnetic sense element 22 to one sidewall 60, sidewall 60 of shield structure 24 also serves to redirect out-of-plane magnetic field 34 (FIG. 2) into in-plane measurement magnetic field 40 (FIG. 1) in a one-sided configuration.

In FIG. 15, magnetic sense element 22 is located in central region 54 encircled by a rectangular configuration of shield structure 24 at a generally centered position of central region 54. Thus, shield structure 24 fully encircles magnetic sense element 22 to suppress stray magnetic fields 42, 44. However, in this configuration the rectangular shape of shield structure 24 is significantly narrowed so that magnetic sense element 22 is very close to two sidewalls 60 of shield structure 24. Due to the proximity of magnetic sense element 22 to two sidewalls 60, shield structure 24 also serves to redirect out-of-plane magnetic field 34 (FIG. 2) into in-plane measurement magnetic field 40 (FIG. 1) in a double-sided configuration.

In FIG. 16, magnetic sense element 22 is located in central region 54 encircled by an elongated elliptical configuration of shield structure 24 at a position that is offset from center point 84 of central region 54. Thus, shield structure 24 fully encircles magnetic sense element 22 to suppress stray magnetic fields 42, 44. Further, due to the proximity of magnetic sense element 22 to continuous structure sidewall 76, shield structure 24 also serves to redirect out-of-plane magnetic field 34 (FIG. 2) into in-plane measurement magnetic field 40 (FIG. 1) in a one-sided configuration.

In FIG. 17, magnetic sense element 22 is located in central region 54 encircled by an elongated elliptical configuration of shield structure 24 at a generally centered position of central region 54. Thus, shield structure 24 fully encircles magnetic sense element 22 to suppress stray magnetic fields 42, 44. However, in this configuration the elliptical shape of shield structure 24 is significantly narrowed so that two sides of magnetic sense element 22 is very close to continuous structure sidewall 76 of shield structure 24. Due to the proximity of two sides of magnetic sense element 22 to continuous structure sidewall 76, shield structure 24 also serves to redirect out-of-plane magnetic field 34 (FIG. 2) into in-plane measurement magnetic field 40 (FIG. 1) in a double-sided configuration.

It should be understood that various alternative geometric configurations of shield structure 24, including but not limited to those shown in FIGS. 7-10 may suitably serve a dual function of both suppressing stray magnetic fields 42, 44 and redirecting out-of-plane magnetic field 34 to produce in-plane measurement magnetic field 40.

Figure 18:
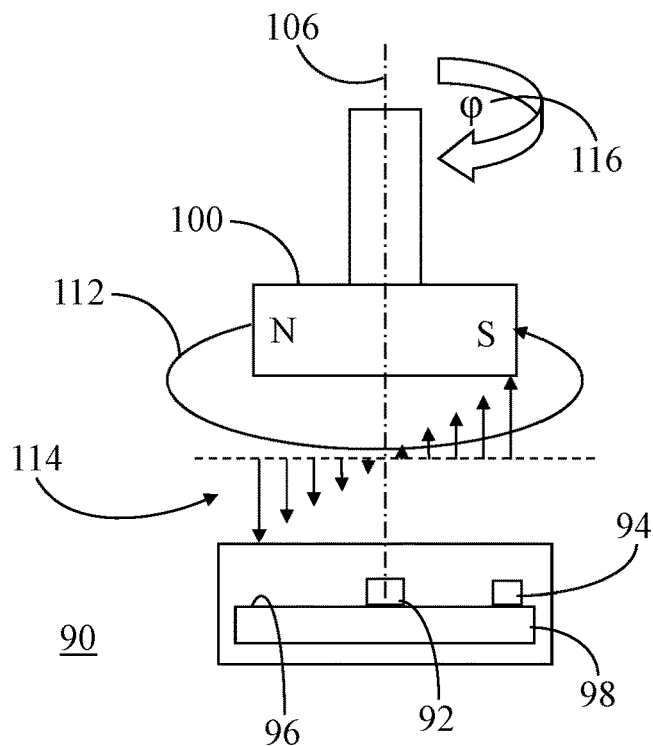
FIG. 18 shows a simplified partial side view a system for rotation angle sensing.
Figure 19:
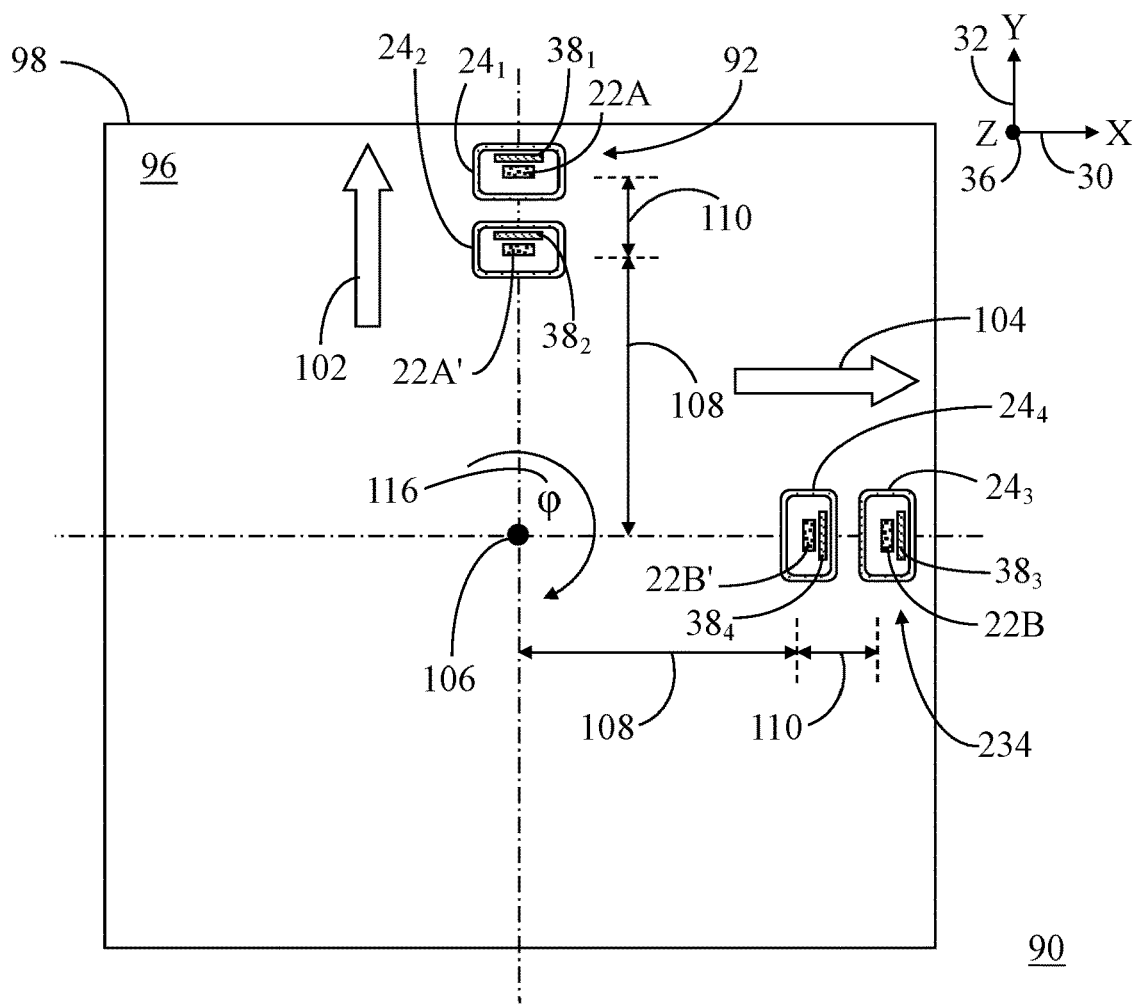
FIG. 19 shows a simplified top view of the system of FIG. 18.

Referring now to FIGS. 18-19, FIG. 18 shows a simplified partial side view a system 90 for rotation angle sensing and FIG. 19 shows a simplified top view of system 90. In the embodiment of FIGS. 18-19, magnetic sense elements 22 with integrated shield structures 24 may be suitably configured to sense angular position of an object in a gradiometer configuration.

System 90 generally includes first and second gradient units 92, 94 formed on a surface 96 of a substrate 98 and a magnet 100 vertically displaced away from first and second gradient units 92, 94 along Z-axis 36. Magnet 100 is not shown in the top view illustrated in FIG. 19 in order to better visualize the features formed on surface 96 of substrate 98. First gradient unit 92 includes a first one of magnetic sense elements (labeled 22A) and one of magnetic field deflection elements (labeled $38_1$) fully encircled by a first shield structure (labeled $24_1$) and a second one of the magnetic sense elements (labeled 22A') and one of magnetic field deflection elements (labeled $38_2$) fully encircled by a second shield structure (labeled $24_2$). Likewise, second gradient unit 94 includes a third one of magnetic sense elements (labeled 22B) and one of magnetic field deflection elements (labeled $38_3$) fully encircled by a third shield structure (labeled $24_3$) and a fourth one of the magnetic sense elements (labeled 22B') and one of magnetic field deflection elements (labeled $38_4$) fully encircled by a fourth shield structure (labeled $24_4$).

In accordance with an embodiment, second gradient unit 94 is rotated ninety degrees relative to first gradient unit 92. That is, a longitudinal dimension of first and second magnetic sense elements, 22A, 22A' and is aligned with X-axis 30. Additionally, a longitudinal dimension of third and fourth magnetic sense elements, 22B, 22B' is aligned with Y-axis 32. Thus, magnetic sense elements 22A, 22A' are configured to sense an in-plane measurement magnetic field 102 along a first sense axis, i.e., Y-axis 32, oriented approximately parallel to surface 96 of substrate 98. Any difference in the magnetic field strength measured by each of magnetic sense elements, 22A, 22A' can be used to determine the magnetic field gradient in a direction parallel to Y-axis 32. Magnetic sense elements 22B, 22B' are configured to sense an in-plane measurement magnetic field 104 along a second sense axis, i.e., X-axis 30, oriented approximately parallel to surface 96 of substrate 98. Any difference in the magnetic field strength measured by each of magnetic sense elements, 22B, 22B' can be used to determine the magnetic field gradient in a direction parallel to X-axis 30.

Second gradient unit 94 is spaced apart from first gradient unit 92 by ninety degrees relative to an axis of rotation 106 perpendicular surface 96 of substrate 98. Additionally, first and second gradient units 92, 94 are located the same radial distance 108 away from axis of rotation 106. Further, first magnetic sense element 22A is laterally spaced apart from second magnetic sense element 22A' by a distance 110 and third magnetic sense element 22B is laterally spaced apart from fourth magnetic sense element 22B' by the same distance 110. In another embodiment, the distance between magnetic sense elements 22A, 22A', 22B, and 22B' may differ.

Magnet 100 may be a permanent magnet in the form of, for example, a disc, ring, rectangle, or bar shape. Magnet 100 is configured to rotate about axis of rotation 106 relative to first and second gradient units 92, 94. Magnet 100 produces a magnetic field 112 that rotates along with magnet 100 relative to first and second gradient units 92, 94. Magnetic field 112 has an out-of-plane magnetic field component 114 having a magnetic field strength that changes as a function of the distance from axis of rotation 106, as represented by varying length arrows. By way of example, the magnetic field strength may be lowest at locations nearest to axis of rotation 106 and greatest at locations farthest from axis of rotation 106.

In an embodiment, out-of-plane magnetic field component 114 is detectable by first and second gradient units 92, 94, and thus may be referred to herein as a magnetic gradient field 114. For example, magnetic field deflection elements $38_1$, $38_2$, $38_3$, $38_4$ may suitably redirect the out-of-plane magnetic field component 114 into the X-Y plane defined by X-axis 30 and Y-axis 32 for detection by magnetic sense elements 22A, 22A', 22B, 22B'. Of course, as mentioned above, magnetic sense elements 22A, 22A', 22B, 22B' may be configured to directly sense an out-of-plane magnetic field. In such a configuration, gradient units 92 and 94 need not include magnetic field deflection elements $38_1$, $38_2$, $38_3$, $38_4$.

As will be discussed below, out-of-plane magnetic field component 114 detected by first and second gradient units 92, 94, may be suitably processed to identify a rotation angle, 116, labeled φ, of magnet 100 relative to first and second gradient units 92, 94. Although only two gradient units (e.g., first and second gradient units 92, 94) are shown, alternative embodiments may include a multitude of gradient units. In such a configuration, the signals of the opposing gradient unit may be averaged or the like. Thus, possible errors from eccentricity and so forth may be mitigated.

Figure 20:
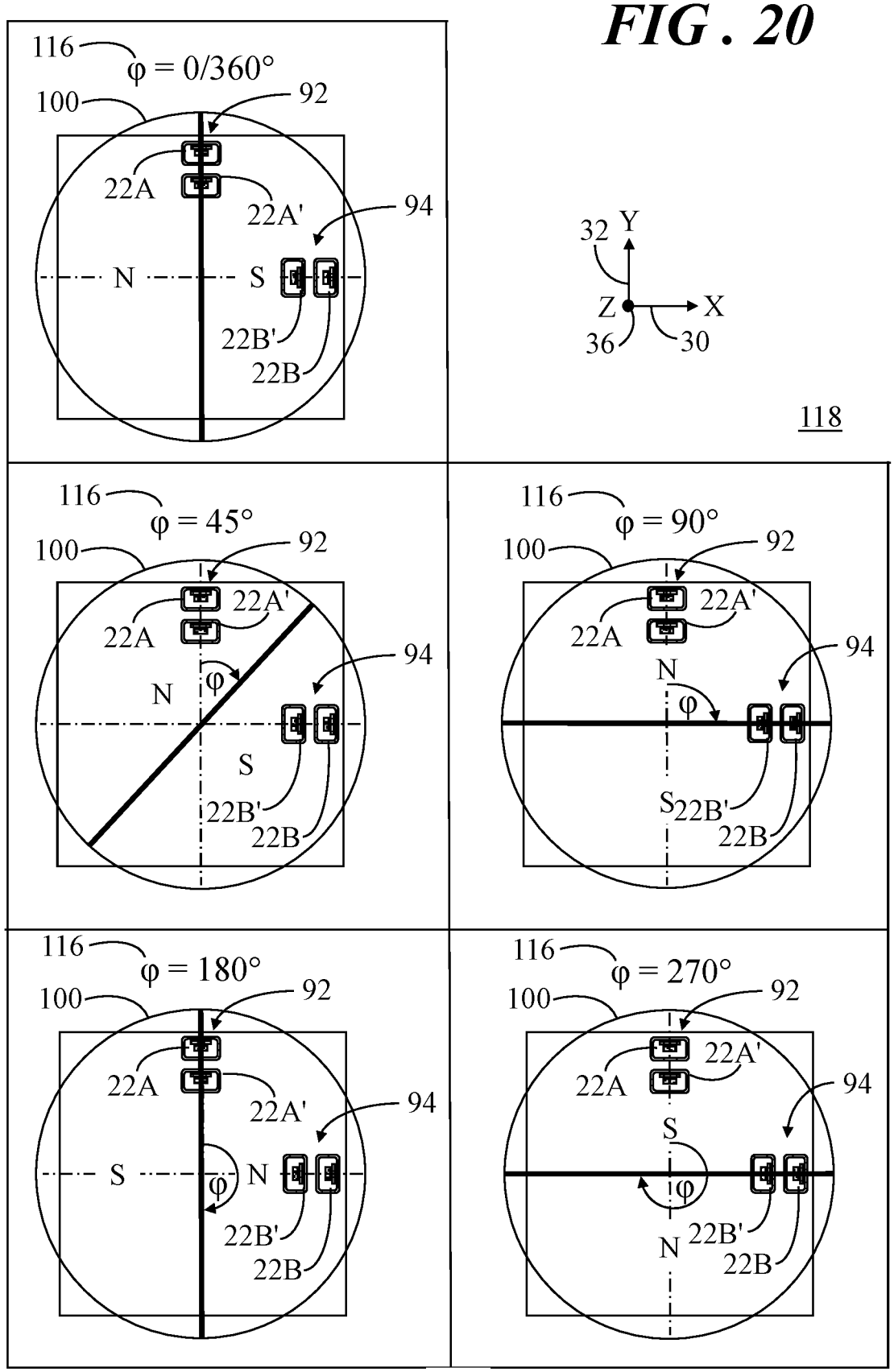
FIG. 20 shows a table of possible positions of a rotating magnet relative to magnetic sense elements of the system of FIG. 18.

FIG. 20 shows a table 118 of possible rotation angles 116, φ, of magnet 100 rotating relative to magnetic sense elements 22A, 22A', 22B, 22B' of first and second gradient units 92, 94 of system 90 (FIG. 18). In this example, magnet 100 is a diametrically magnetized magnet that is magnetized across its diameter, having the north and south poles located at opposing sides of magnet 100 relative to its diameter. The rotation angles 116 shown in table 118 include φ equal to 0 or 360°, φ=45°, φ=90°, φ=180°, and φ=270°. Rotation angles 116 shown in FIG. 20 are provided as examples only. It should be understood that can be many more possible rotation angles 116 ranging between 0 and 360°.

Figure 21:
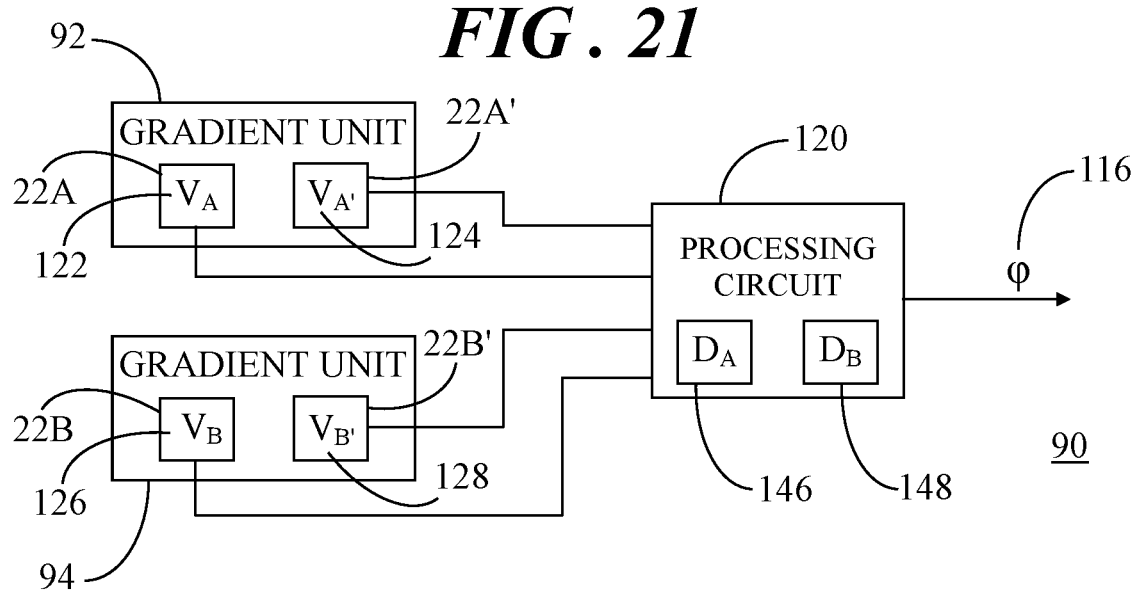
FIG. 21 shows a block diagram of the system of FIG. 18.

FIG. 21 shows a block diagram of system 90. First gradient unit 92 including first and second magnetic sense elements 22A, 22A' fully encircled by shield structures (not shown, described above) have inputs coupled to a processing circuit 120. Likewise, second gradient unit 94 including third and fourth magnetic sense elements 22B, 22B' fully encircled by shield structures (not shown, described above) have inputs coupled to processing circuit 120. First magnetic sense element 22A is configured to produce a first output signal 122, $V_A$, in response to out-of-plane magnetic field component 114 of magnetic field 112 (FIG. 18). Second magnetic sense element 22A' is configured to produce a second output signal 124, $V_{A'}$, in response to out-of-plane magnetic field component 114 (FIG. 18) of magnetic field 112. Third magnetic sense element 22B is configured to produce a third output signal 126, $V_B$, in response to out-of-plane magnetic field component 114 of magnetic field 112. And fourth magnetic sense element 22B' is configured to produce a fourth output signal 128, $V_{B'}$, in response to out-of-plane magnetic field component 114 of magnetic field 112.

Figure 22:
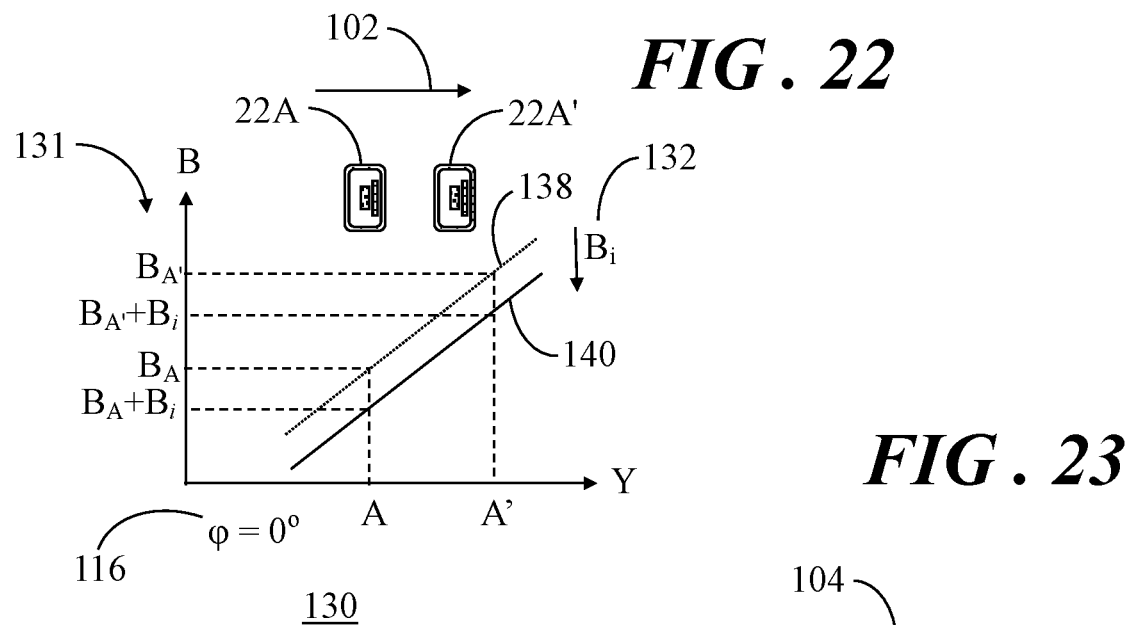
FIG. 22 shows a graph of a magnetic gradient field distribution for a first gradient unit of the system of FIG. 18.
Figure 23:
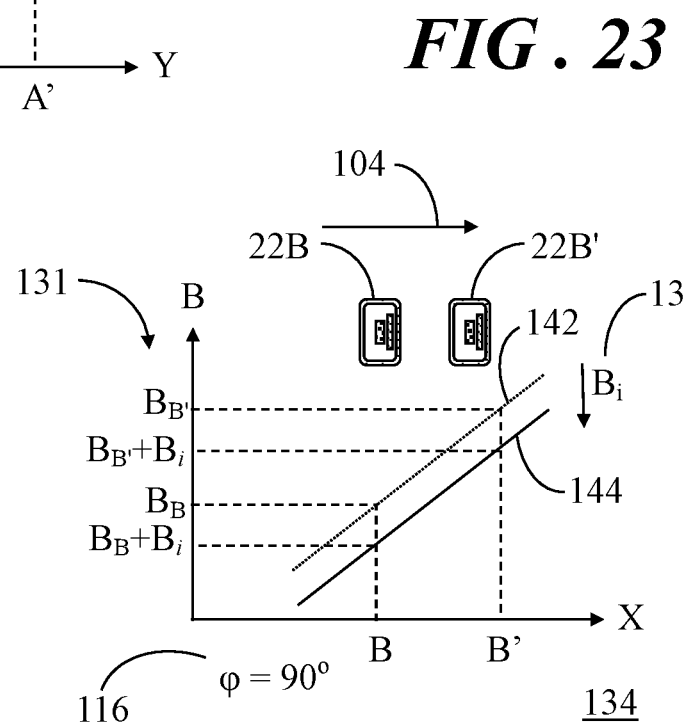
FIG. 23 shows a graph of a magnetic gradient field distribution for a second gradient unit of the system of FIG. 18.

Referring to FIGS. 22-23 in connection with the block diagram of FIG. 21, FIG. 22 shows a graph 130 of an example a magnetic gradient field distribution in a direction parallel to Y-axis 32 (FIG. 19) produced by magnet 100 (FIG. 18). That is, graph 130 demonstrates the change in the deflected in-plane measurement magnetic field 102 parallel to Y-axis 32 in response to the out-of-plane magnetic field component 114 (FIG. 18) produced by magnet 100 (FIG. 18). This example is provided for the case in which rotation angle 116, φ, is equal to 90°, as presented above in connection with FIG. 20. The magnetic gradient field distribution is shown with and without the presence of a magnetic interference field component 132, $B_i$. Likewise, FIG. 23 shows a graph 134 of an example of a magnetic gradient field distribution in a direction parallel to X-axis 30 (FIG. 19) produced by magnet 100. That is, graph 134 demonstrates the change in the deflected in-plane measurement field 104 parallel to X-axis 130 in response to the out-of-plane magnetic field component 114 produced by magnet 100. This example is provided for the case in which rotation angle 116, φ, is equal to 90°, as presented above in connection with FIG. 20. The magnetic gradient field distribution is shown with and without the presence of a magnetic interference field component 136, $B_i$.

Multiplication of in-plane measurement magnetic field 102 with the sensor sensitivity, S (discussed below), results in first and second output voltage signals 122, 124 (FIG. 21). Likewise, multiplication of in-plane measurement magnetic field 104 with the sensor sensitivity, S, results in third and fourth output voltage signals 126, 128 (FIG. 21). As a consequence, FIGS. 22-23 can be associated with the block diagram of FIG. 21. FIG. 22 thus shows graph 130 of the magnetic field strength resulting in first and second output voltage signals 122, 124 for first gradient unit 92 and an effect that magnetic interference field component 132, $B_i$, may have on first and second output voltage signals 122, 124. Likewise, FIG. 22 thus shows graph 134 of the magnetic field strength resulting third and fourth output voltage signals 126, 128 for second gradient unit 94 and an effect that magnetic interference field component 136, $B_i$, may have on third and fourth output voltage signals 126, 128.

In FIG. 22, a dotted line 138 represents a linear gradient range and related magnetic field/magnetic flux, B, 131 (resulting in first and second output voltage signals 122,124) at the relative positions defined by radial distance 108 (FIG. 19) from axis of rotation 106 (FIG. 19) and distance 110 (FIG. 19) between first and second magnetic sense elements 22A, 22A'. A solid line 140 represents a linear gradient range and related magnetic field/magnetic flux 131 (resulting in first and second output voltage signals 122, 124) with an additional spatial homogenous interference magnetic field component 132, $B_i$. Likewise, in FIG. 23, a dotted line 142 represents a linear gradient range and related magnetic field/magnetic flux 131 (resulting in third and fourth output voltage signals 126, 128) at the relative positions defined by radial distance 108 from axis of rotation 106 and distance 110 between third and fourth magnetic sense elements 22B, 22B'. A solid line 144 represents a linear gradient range and related magnetic field/magnetic flux 131 (resulting in third and fourth output voltage signals 126, 128) with an additional spatial homogenous magnetic interference field component 136, $B_i$.

Processing circuit 120 may be an application specific integrated circuit (ASIC) that includes a combination of hardware and software for suitably processing first, second, third, and fourth output voltage signals 122, 124, 126, 128 to identify rotation angle 116. Processing circuit 120 is electrically coupled with first gradient unit 92 and is configured to produce a first differential output signal 146 as a difference between first and second output voltage signals 122, 124, the difference between first and second output voltage signals 122, 124 cancelling magnetic interference field component 132. Additionally, processing circuit 120 is electrically coupled with second gradient unit 94 and is configured to produce a second differential output signal 148 as a difference between third and fourth output voltage signals 126, 128, the difference between the third and fourth output voltage signals 126, 128 cancelling magnetic interference field component 136. Shield structure 24 (FIG. 1) suppresses stray magnetic fields 42, 44 (FIG. 1), thus largely eliminating their effect on the sensitivity of the magnetic sense elements 22A, 22A', 22B, 22B'. Rotation angle 116 of magnet 100 (FIG. 18) relative to first and second gradient units 92, 94 can thereafter be identified by division of the first and second differential output signals.

An output voltage $V_A$ and $V_{A'}$ (i.e., first and second output voltage signals 122, 124) of first and second magnetic sense elements 22A and 22A' of first gradient unit 92 can be described as follows:

$$V_A = S \times B_A \quad (1)$$

$$V_{A'} = S \times B_{A'} \quad (2)$$

S is the sensitivity of the magnetic sense elements and is assumed to be equal for both of first and second magnetic sense elements 22A, 22A' (e.g., achieved by fabrication accuracy or trimming). The spatial homogenous magnetic interference field component 132, $B_i$, leads to the same voltage shift in both of first and second magnetic sense elements 22A, 22A' as follows:

$$V_A = S \times B_A S \times B_i \quad (3)$$

$$V_{A'} = S \times B_{A'} + S \times B_i \quad (4)$$

Calculation of differential output signal 146, $D_A$ (FIG. 21) entails taking the difference of the two voltage signals and thereby cancelling magnetic interference field component 132, as follows:

$$D_A = V_{A'} - V_A = (S \times B_{A'} S \times B_i) - (S \times B_A S \times B_i) = S \times (B_{A'} - B_A) \quad (5)$$

Similarly, output voltage $V_B$ and $V_{B'}$ (i.e., third and fourth output voltage signals 126, 128) of third and fourth magnetic sense elements 22B and 22B' of second gradient unit 94 can be described as follows:

$$V_B = S \times B_B \quad (6)$$

$$V_{B'} = S \times B_{B'} \quad (7)$$

Again, S is the sensitivity of the magnetic sense elements and is assumed to be equal for both of third and fourth magnetic sense elements 22B, 22B' (e.g., achieved by fabrication accuracy or trimming). The spatial homogenous magnetic interference field component 136, $B_i$, leads to the same voltage shift in both of third and fourth magnetic sense elements 22B, 22B' as follows:

$$V_B = S \times B_B S \times B_i \quad (8)$$

$$V_{B'} = S \times B_{B'} S \times B_i \quad (9)$$

Calculation of differential output signal 148, $D_A$ (FIG. 21) entails taking the difference of the two voltage signals and thereby cancelling magnetic interference field component 136, as follows:

$$D_B = V_{B'} - V_B = (S \times B_{B'} S \times B_i) - (S \times B_B + S \times B_i) = S \times (B_{B'} - B_B) \quad (10)$$

Figure 24:
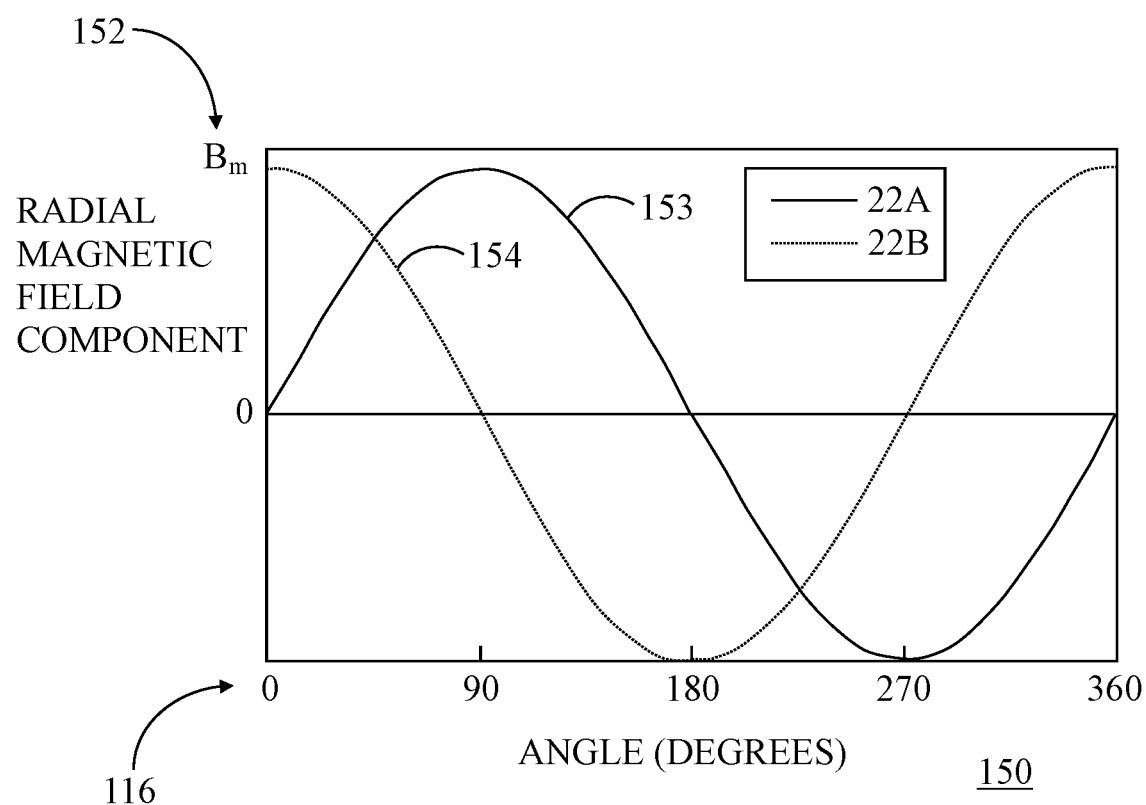
FIG. 24 shows a graph of a change of a magnetic field at the first and second gradient units of the system of FIG. 18 as functions of a rotation angle.

FIG. 24 shows a graph 150 of a change of a magnetic field 152 at the positions of first and second gradient units 92, 94 (FIG. 19) as functions of rotation angle 116. A solid curve 153 represents a change of magnetic field component 152 at sensing element 22A and a dotted curve 154 represents a change of magnetic field component 152 at sensing element 22B as a functions of rotation angle 116. With regard to graph 150, magnetic gradient field 114 (FIG. 18) at the position of first and second magnetic sense elements 22A, 22A' of first gradient unit 92 can be described as:

$$B_A = B_m \times \sin \varphi \quad (11)$$

$$B_{A'} = B_m \times \sin \varphi \quad (12)$$

In equation (11), $B_m$ represents the amplitude of the redirected/deflected in-plane magnetic field. Due to the ninety-degree rotated arrangement of first and second gradient units, the mathematical relationship of third and fourth magnetic sense elements 22B, 22B' of second gradient unit 94 can be described as:

$$B_B = B_m \times \cos \varphi \quad (13)$$

$$B_{B'} = B_m \times \cos \varphi \quad (14)$$

The magnetic field gradient for first gradient unit 92 can therefore be described as:

$$B_{A'} - B_A = B_m \times \sin \varphi - B_m \times \sin \varphi = (B_m - B_m) \times \sin \varphi = B_{mGA} \times \sin \varphi \quad (15)$$

The operator $B_{mGA}$ is equal to $(B_m - B_m)$. Similarly, the magnetic field gradient for second gradient unit 94 can be described as:

$$B_{B'} - B_B = B_m \times \cos \varphi - B_m \times \cos \varphi = (B_m - B_m) \times \cos \varphi = B_{mGA} \times \cos \varphi \quad (16)$$

By substituting equation (15) into equation (5), the differential output voltage 146, $D_A$, can be determined as follows:

$$D_A = S \times B_{mGA} \times \sin \varphi \quad (17)$$

By substituting equation (16) into equation (10), the differential output voltage 148, $D_B$, can be determined as follows:

$$D_B = S \times B_{mGA} \times \cos \varphi \quad (18)$$

Thus, angular position 116, $\varphi$, can be calculated by division of the differential output voltages, $D_A$ and $D_B$, as follows:

$$\frac{D_A}{D_B} = \frac{S \times B_{mGA} \times \sin \varphi}{S \times B_{mGA} \times \cos \varphi} = \tan \varphi \quad (19)$$

Thus, the angular position, i.e., rotation angle 116, of magnet 100 (FIG. 18) can be identified utilizing the differential output voltages, $D_A$ and $D_B$, as follows:

$$\varphi = \arctan \frac{D_A}{D_B} \quad (20)$$

Figure 25:
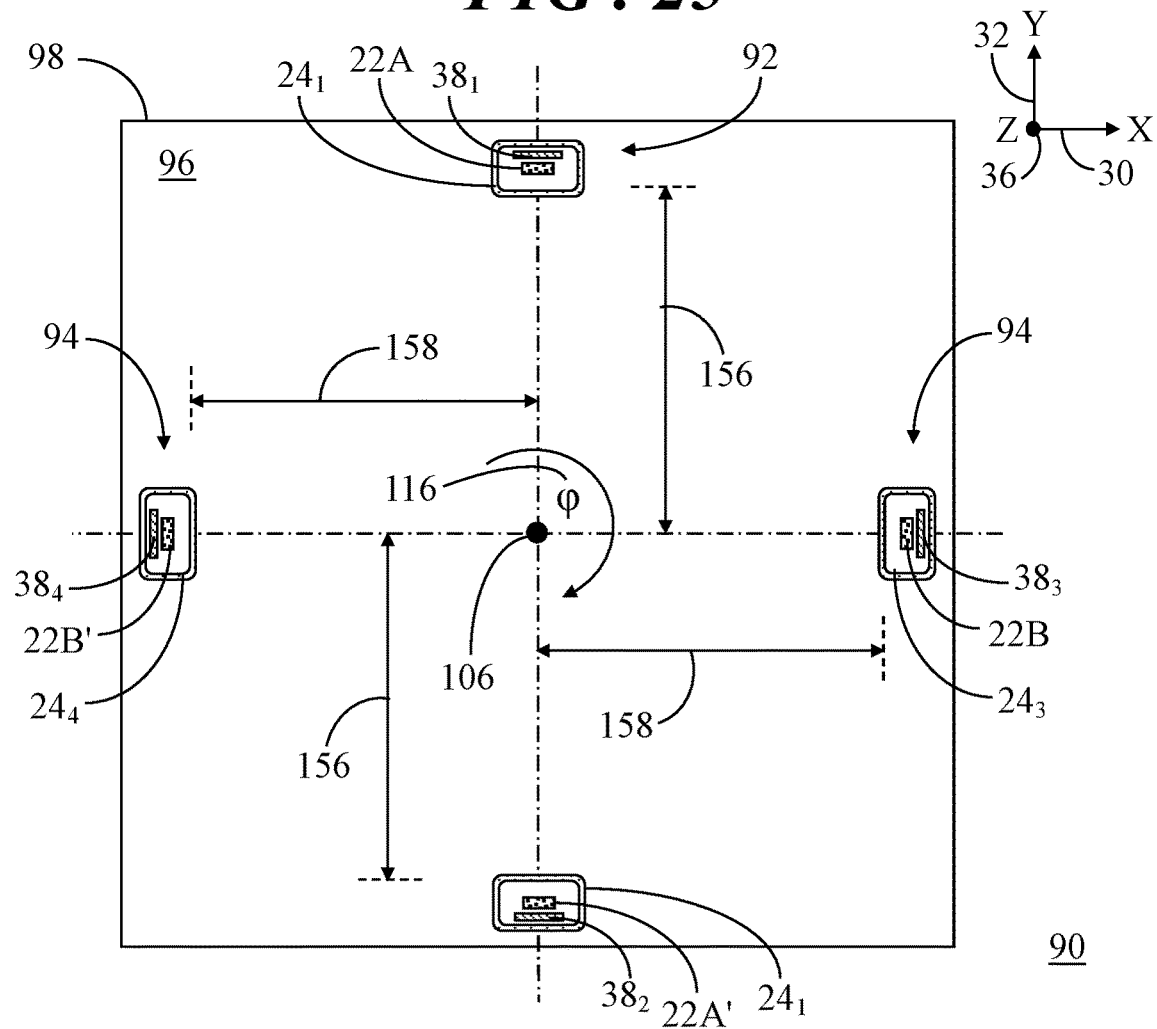
FIG. 25 shows a simplified top view of the magnetic sense elements of the first and second gradient units in a symmetric position relative to an axis of rotation.

FIG. 25 shows a simplified top view of magnetic sense elements 22A, 22A', 22B, 22B' of first and second gradient units 92, 94 in a symmetric position relative to axis of rotation 106. Again, first gradient unit 92 includes a first one of magnetic sense elements (labeled 22A) and one of magnetic field deflection elements (labeled $38_1$) fully encircled by a first shield structure (labeled $24_1$) and a second one of the magnetic sense elements (labeled 22A') and one of magnetic field deflection elements (labeled $38_2$) fully encircled by a second shield structure (labeled $24_2$). Likewise, second gradient unit 94 includes a third one of magnetic sense elements (labeled 22B) and one of magnetic field deflection elements (labeled $38_3$) fully encircled by a third shield structure (labeled $24_3$) and a fourth one of the magnetic sense elements (labeled 22B') and one of magnetic field deflection elements (labeled $38_4$) fully encircled by a fourth shield structure (labeled $24_4$).

However, magnetic sense elements 22A, 22A' of first gradient unit 92 are disposed in the Y-direction on opposing sides of X-axis 30. Further, magnetic sense elements 22A, 22A' are displaced away from X-axis 30 by the same distance 156. Similarly, magnetic sense elements 22B, 22B' of second gradient unit 94 are disposed in the X-direction on opposing sides of Y-axis 32. Further, magnetic sense elements 22B, 22B' are displaced away from Y-axis 32 by the same distance 158. In other embodiments, distances 156, 158 need not be the same. Equations (1) through (20) described above may be implemented in connection with the configuration of FIG. 25 to determine rotation angle 116.

In general, a larger the distance between the magnetic sense elements of a gradient unit can yield a larger magnetic field gradient (i.e., the difference between the magnetic field strength measured at each of the two magnetic sense elements). This larger magnetic field gradient can enable greater tolerance of the width of an air gap between magnet 100 (FIG. 18) and first and second gradient units 92, 94. A larger maximum permissible air gap may enable a relaxation of restrictions on the mechanical tolerances of the angular position sensor without incurring potential signal loss, e.g., signal dropouts, during operation.

Figure 26:
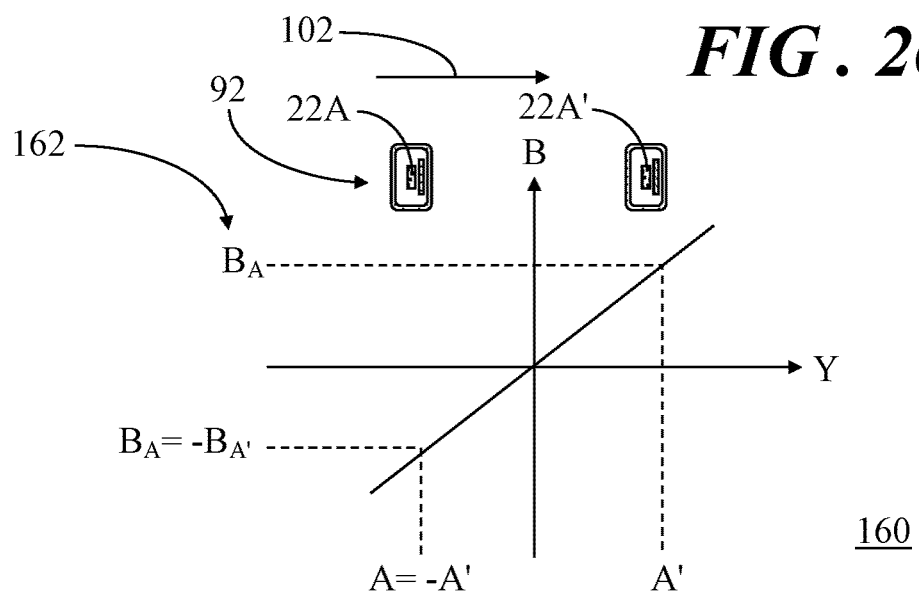
FIG. 26 shows a graph of an example magnetic gradient field distribution along the sensing axis for a first gradient unit of the configuration of FIG. 25.

FIG. 26 shows a graph 160 of an example magnetic gradient field distribution along the sensing axis (e.g., Y-axis 32) for first gradient unit 92 of the configuration of FIG. 25. That is, graph 160 demonstrates the change in magnetic field strength 162 of the redirected/deflected in-plane measurement magnetic field 102 parallel to Y-axis 32 in response to the out-of-plane magnetic gradient field 114 (FIG. 18) produced by magnet 100 (FIG. 18). This example is provided for the case in which rotation angle 116, φ, is equal to 90°, as presented above in connection with FIG. 20. When magnetic sense elements 22A, 22A' are spaced the same distance 156 (FIG. 25) away from axis of rotation 106, the magnitude of magnetic field, $B_A$, sensed at magnetic sense element 22A will be equivalent to, but opposite in sign from, the magnetic field, $-B_A$, sensed at magnetic sense element 22A'.

Figure 27:
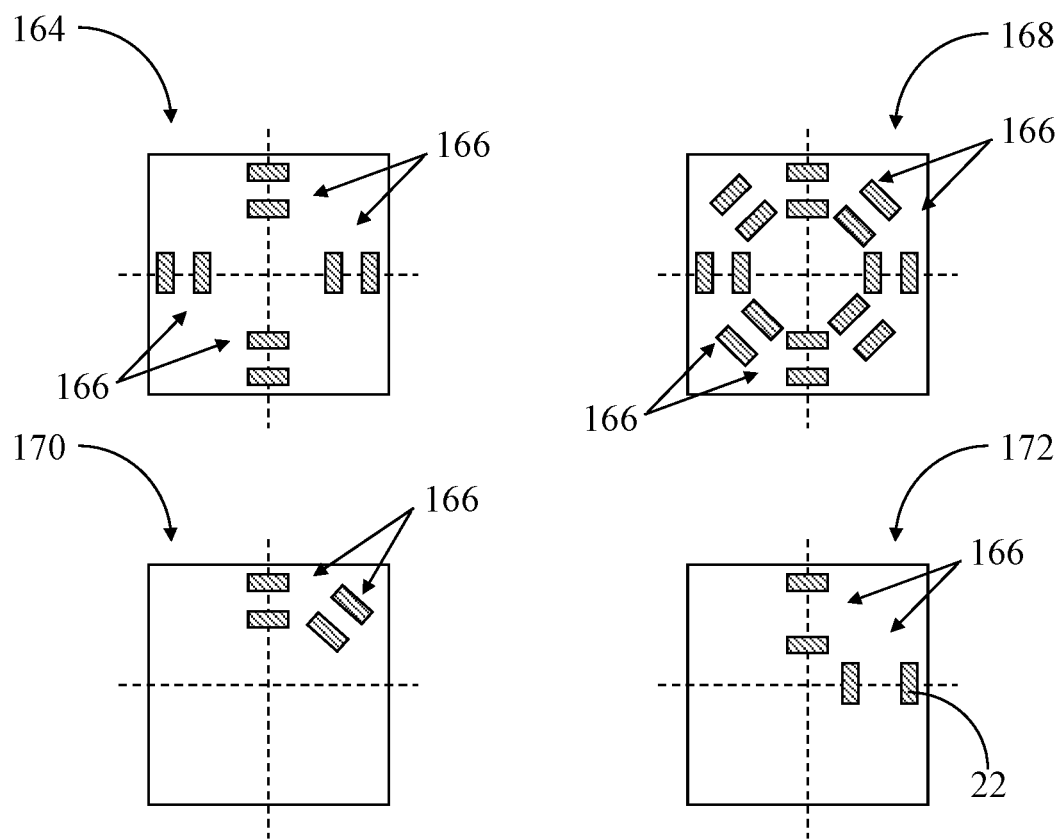
FIG. 27 shows various simplified top views showing positions of gradient units that may alternatively be incorporated into the system of FIG. 18.

FIG. 27 shows various simplified top views showing positions of gradient units that may alternatively be incorporated into the system of FIG. 18. As mentioned previously, alternative embodiments of system 90 (FIG. 18) may include a multitude of gradient units. Further, these gradient units may be arranged differently. Accordingly, FIG. 27 includes a first configuration 164 having four gradient units 166 each separated by 90°. Additionally, a second configuration 168 is shown having eight gradient units 166, each separated by 45°. A third configuration 170 is shown having two gradient units 166, separated by 45°. And a fourth configuration 172 is shown having two gradient units 166, in which the magnetic sense elements 22 are separated by a greater distance than that shown previously. FIG. 27 only shows a few configurations of gradient units. Other configurations may be equivalently applicable.

Embodiments described herein entail magnetic field sensors and magnetic field sensor systems with integrated magnetic field shield structures for measuring magnetic fields while suppressing stray magnetic fields. An embodiment of magnetic field sensor comprises a magnetic sense element formed on a substrate and a shield structure formed on the substrate and fully encircling the magnetic sense element, the shield structure being configured to suppress stray magnetic fields along a first axis and a second axis, wherein the first and second axes are parallel to a surface of the substrate and perpendicular to one another.

Another embodiment of a magnetic field sensor comprises a magnetic sense element formed on an active silicon substrate, a shield structure formed on the active silicon substrate and fully encircling the magnetic sense element, the shield structure being configured to suppress stray magnetic fields along a first axis and a second axis, and a magnetic field deflection element formed on the substrate proximate the magnetic sense element and fully encircled by the shield structure. The first and second axes are parallel to a surface of the substrate and perpendicular to one another, a magnetic field is oriented along a third axis perpendicular to a surface of the active silicon substrate, the magnetic sense element is configured to sense a measurement magnetic field along the first axis, and the magnetic field deflection element is configured to redirect the magnetic field from the third axis into the first axis to be sensed as the measurement magnetic field by the magnetic sense element.

An embodiment of a magnetic field sensor system comprises a gradient unit formed on a substrate. The gradient unit comprises a first magnetic sense element and a first shield structure fully encircling the first magnetic sense element, the first shield structure being configured to suppress stray magnetic fields along a first axis and a second axis, wherein the first and second axes are parallel to a surface of the substrate and perpendicular to one another. The gradient unit further comprises a second magnetic sense element formed on the substrate and a second shield structure formed on the substrate and fully encircling the second magnetic sense element, the second shield structure being configured to suppress the stray magnetic fields along the first axis and the second axis. The first and second magnetic sense elements are laterally spaced apart from one another and configured to sense a magnetic field along a third axis oriented perpendicular to a surface of the substrate, wherein the gradient unit is configured to determine a magnetic field gradient in response to the sensed magnetic field at each of the first and second magnetic sense elements.

The magnetic field shield structures may be vertically integrated with the magnetic sense elements to achieve reductions in size and cost savings. Further, the magnetic field sense elements with the shield structures can be implemented in various system configurations for the purpose of rotation angle sensing. The shield structures can effectively suppress stray fields along the non-sensing axis or axes and the gradiometer configuration can cancel stray magnetic fields along the sensing axis to positively enhance the magnetic field detection quality.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A magnetic field sensor comprising:
a magnetic sense element formed on a substrate; and
a shield structure formed on the substrate and fully encircling the magnetic sense element, the shield structure being configured to suppress stray magnetic fields along a first axis and a second axis, wherein the first and second axes are parallel to a surface of the substrate and perpendicular to one another.

2. The magnetic field sensor of claim 1 wherein the shield structure encircles the magnetic sense element along the first and second axes parallel to the surface of the substrate, and the shield structure does not encircle the magnetic sense element in a direction perpendicular to the surface of the substrate.

3. The magnetic field sensor of claim 1 wherein the magnetic sense element is configured to sense an external magnetic field along a third axis oriented perpendicular to a surface of the substrate.

4. The magnetic field sensor of claim 1 wherein an external magnetic field is oriented along a third axis perpendicular to a surface of the substrate, the magnetic sense element is configured to sense a measurement magnetic field along the first axis, and the magnetic field sensor further comprises a magnetic field deflection element formed on the substrate proximate the magnetic sense element, wherein the magnetic field deflection element is configured to redirect the external magnetic field from the third axis into the first axis to be sensed as the measurement magnetic field by the magnetic sense element.

5. The magnetic field sensor of claim 4 wherein the shield structure additionally encircles sidewalls of the magnetic field deflection element.

6. The magnetic field sensor of claim 1 wherein the shield structure comprises first structure sidewalls facing one another and second structure sidewalls facing one another, wherein first ends of the first structure sidewalls are coupled to second ends of the second structure sidewalls to yield a rectangular configuration for the shield structure, the rectangular configuration having a central region, and the magnetic sense element is located in the central region.

7. The magnetic field sensor of claim 6 wherein each intersection of one of the first ends with one of the second ends exhibits a curved shape.

8. The magnetic field sensor of claim 1 wherein the shield structure comprises a continuous structure sidewall to yield an elliptical configuration for the shield structure, the elliptical configuration having a central region, and the magnetic sense element is located in the central region.

9. The magnetic field sensor of claim 1 wherein the shield structure encircles a central region, and the magnetic sense element is located in the central region at a position that is offset from a center point of the central region.

10. The magnetic field sensor of claim 1 wherein the magnetic sense element is a first magnetic sense element, the shield structure is a first shield structure, and the magnetic field sensor further comprises:
a second magnetic sense element formed on the substrate; and
a second shield structure formed on the substrate and fully encircling sidewalls of the second magnetic sense element, the second shield structure being configured to suppress the stray magnetic fields along the first axis and the second axis.

11. The magnetic field sensor of claim 10 wherein the first and second magnetic sense elements are spaced apart from one another to form a gradient unit configured to determine a magnetic field gradient.

12. The magnetic field sensor of claim 11 wherein the gradient unit is implemented in an angular position sensor.

13. The magnetic field sensor of claim 1 wherein the substrate is an active silicon substrate.

14. A magnetic field sensor comprising:
a magnetic sense element formed on an active silicon substrate;
a shield structure formed on the active silicon substrate and fully encircling the magnetic sense element, the shield structure being configured to suppress stray magnetic fields along a first axis and a second axis; and
a magnetic field deflection element formed on the substrate proximate the magnetic sense element and fully encircled by the shield structure, wherein the first and second axes are parallel to a surface of the substrate and perpendicular to one another, a magnetic field is oriented along a third axis perpendicular to a surface of the active silicon substrate, the magnetic sense element is configured to sense a measurement magnetic field along the first axis, and the magnetic field deflection element is configured to redirect the magnetic field from the third axis into the first axis to be sensed as the measurement magnetic field by the magnetic sense element.

15. The magnetic field sensor of claim 14 wherein the shield structure comprises first structure sidewalls facing one another and second structure sidewalls facing one another, wherein first ends of the first structure sidewalls are coupled to second ends of the second structure sidewalls to yield a rectangular configuration for the shield structure, the rectangular configuration having a central region, and wherein the magnetic sense element and the magnetic field deflection element are located in the central region.

16. The magnetic field sensor of claim 14 wherein the shield structure comprises a continuous structure sidewall to yield an elliptical configuration for the shield structure, the elliptical configuration having a central region, and wherein the magnetic sense element and the magnetic field deflection element are located in the central region.

17. The magnetic field sensor of claim 14 wherein the shield structure encircles a central region, the magnetic sense element and the magnetic field deflection element are located in the central region, and the magnetic sense element is located at a position that is offset from a center point of the central region.

18. A magnetic field sensor system comprising:
a gradient unit formed on a substrate, the gradient unit comprising:
a first magnetic sense element;
a first shield structure fully encircling the first magnetic sense element, the first shield structure being configured to suppress stray magnetic fields along a first axis and a second axis, wherein the first and second axes are parallel to a surface of the substrate and perpendicular to one another;

a second magnetic sense element formed on the substrate; and a second shield structure formed on the substrate and fully encircling the second magnetic sense element, the second shield structure being configured to suppress the stray magnetic fields along the first axis and the second axis, wherein the first and second magnetic sense elements are laterally spaced apart from one another and configured to sense a magnetic field along a third axis oriented perpendicular to a surface of the substrate, wherein the gradient unit is configured to determine a magnetic field gradient in response to the sensed magnetic field at each of the first and second magnetic sense elements.

19. The magnetic field sensor system of claim 18 further comprising a magnet configured to rotate about an axis of rotation relative to the gradient unit, the magnet producing the magnetic field.

20. The magnetic field sensor system of claim 18 wherein the gradient unit is implemented in an angular position sensor.

\* \* \* \* \*